US011790974B2

(12) United States Patent
Geiger et al.

(10) Patent No.: US 11,790,974 B2
(45) Date of Patent: Oct. 17, 2023

(54) APPARATUSES AND METHODS FOR REFRESH COMPLIANCE

(71) Applicant: MICRON TECHNOLOGY, INC., Boise, ID (US)

(72) Inventors: Markus Geiger, Boise, ID (US); Randall Rooney, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 114 days.

(21) Appl. No.: 17/529,182

(22) Filed: Nov. 17, 2021

(65) Prior Publication Data
US 2023/0154519 A1    May 18, 2023

(51) Int. Cl.
G11C 11/406      (2006.01)
G11C 11/4072     (2006.01)
G11C 11/4076     (2006.01)
G11C 11/408      (2006.01)
G11C 11/4096     (2006.01)

(52) U.S. Cl.
CPC .... G11C 11/40615 (2013.01); G11C 11/4072 (2013.01); G11C 11/4076 (2013.01); G11C 11/4085 (2013.01); G11C 11/4096 (2013.01); G11C 11/40622 (2013.01)

(58) Field of Classification Search
CPC ........ G11C 11/40615; G11C 11/40622; G11C 11/4072; G11C 11/4076; G11C 11/4085; G11C 11/4096
See application file for complete search history.

(56) References Cited

U.S. PATENT DOCUMENTS

| 5,802,555 | A  | 9/1998 | Shigeeda       |
| 6,566,929 | B2 | 5/2003 | Pyo            |
| 6,754,126 | B2 | 6/2004 | Yamaguchi et al.|
| 7,203,115 | B2 | 4/2007 | Eto et al.     |
| 7,529,146 | B2 | 5/2009 | Moon et al.    |
| 7,746,718 | B2 | 6/2010 | Eguchi et al.  |

(Continued)

FOREIGN PATENT DOCUMENTS

CN    1530962 A    9/2004
CN    1574081 A    2/2005
(Continued)

OTHER PUBLICATIONS

U.S. Appl. No. 16/259,052, titled "Apparatuses and Methods for Detection Refresh Starvation of a Memory", filed Jan. 28, 2019, pp. all pages of application as filed.
(Continued)

Primary Examiner — Ajay Ojha
(74) Attorney, Agent, or Firm — Dorsey & Whitney LLP

(57) ABSTRACT

A memory device may enforce compliance with a refresh command requirement in some examples. When a controller fails to comply with the refresh command requirement, the memory device may prevent the controller from accessing a memory array. The controller may regain access by providing one or more commands, such as a refresh command. In some examples, the memory may enforce compliance with a refresh command requirement responsive to a value written to the mode register. In some examples, the memory may enforce compliance with the refresh command requirement after an initialization operation has completed.

30 Claims, 6 Drawing Sheets

(56) References Cited

U.S. PATENT DOCUMENTS

| | | |
|---|---|---|
| 8,743,643 B2 | 6/2014 | Kim et al. |
| 10,192,608 B2 | 1/2019 | Morgan |
| 10,522,207 B2 * | 12/2019 | Bains .................. G06F 13/1636 |
| 2002/0159318 A1 | 10/2002 | Arimoto et al. |
| 2005/0002254 A1 | 1/2005 | Otsuka et al. |
| 2005/0280479 A1 | 12/2005 | Lin |
| 2006/0087882 A1 | 4/2006 | Kinsley |
| 2006/0294291 A1 | 12/2006 | Kinsley |
| 2008/0151670 A1 | 6/2008 | Kawakubo et al. |
| 2009/0106503 A1 | 4/2009 | Lee et al. |
| 2009/0154279 A1 | 6/2009 | Hong et al. |
| 2009/0172267 A1 | 7/2009 | Oribe et al. |
| 2009/0248972 A1 | 10/2009 | Perego et al. |
| 2010/0162068 A1 | 6/2010 | Toda |
| 2010/0182862 A1 | 7/2010 | Teramoto |
| 2012/0014199 A1 | 1/2012 | Narui |
| 2016/0139983 A1 * | 5/2016 | Chang .................... G11C 29/52 714/49 |
| 2017/0024148 A1 | 1/2017 | Crawford et al. |
| 2017/0117030 A1 | 4/2017 | Fisch et al. |
| 2017/0352400 A1 | 12/2017 | Kim |
| 2018/0342282 A1 | 11/2018 | Morgan |
| 2019/0172521 A1 | 6/2019 | Morgan |
| 2019/0295627 A1 | 9/2019 | Ishikawa |
| 2019/0333566 A1 | 10/2019 | Kim et al. |
| 2019/0333570 A1 | 10/2019 | Kim et al. |
| 2020/0201718 A1 * | 6/2020 | Richter ............... G06F 11/1004 |
| 2021/0064114 A1 | 3/2021 | Troia |
| 2021/0208965 A1 | 7/2021 | Cha et al. |
| 2021/0241822 A1 | 8/2021 | Vogelsang |
| 2022/0051715 A1 * | 2/2022 | Kim ................... G11C 11/4096 |

FOREIGN PATENT DOCUMENTS

| | | |
|---|---|---|
| CN | 101292249 A | 10/2008 |
| JP | 2003056563 A1 | 7/2003 |
| JP | 2005317196 A | 11/2005 |
| JP | 2015162253 A | 9/2015 |
| KR | 20160068430 A | 6/2016 |
| KR | 20160144516 A | 12/2016 |
| WO | 2017070050 A1 | 4/2017 |
| WO | 2018217582 A2 | 11/2018 |
| WO | 2020132204 A1 | 6/2020 |

OTHER PUBLICATIONS

PCT Application No. PCT/US18/33494, titled "Apparatuses and Methods for Detection Refresh Starvation of a Memory", filed May 18, 2018, pp. all pages of application as filed.

U.S. Appl. No. 15/281,818, entitled "Semiconductor Device", filed Sep. 30, 2016, pp. all pages of application as filed.

EN Translation of CN Office Action dated Sep. 19, 2022 for CN Application No. 201880031828.X; pp. all.

PCT application No. PCT/US2022/079332 titled, "Apparatuses and Methods for Refresh Compliance" filed on Nov. 4, 2022, pp. all pages of application as filed.

International Search Report & Written Opinion dated Mar. 8, 2023 for PCT Application No. PCT/US2022/079332; pp. all.

* cited by examiner

APPARATUSES AND METHODS FOR REFRESH COMPLIANCE

BACKGROUND

A dynamic random access memory (DRAM), which may be a semiconductor memory device, stores information by charges accumulated in cell capacitors (e.g., memory cells) that gradually discharge. Thus, the information may be lost unless refresh operations are periodically carried out. Refresh commands are periodically issued from an external device, such as a memory controller, to cause the memory to perform refresh operations. The refresh commands should be issued at a frequency that ensures refresh operations are performed at a frequency sufficient to preserve the data in the memory cells. Timing of refresh operations performed by a memory device is specified by a refresh interval time (tREFI).

BRIEF DESCRIPTION OF THE DRAWINGS

Embodiments of the present disclosure will be described in detail with reference to accompanying drawings.

DETAILED DESCRIPTION

A refresh interval time (tREFI) for a memory device may be based on a data retention characteristic of the memory device (e.g., an expected rate of data degradation of memory cells). The parameter tREFI may be indicated by one or more specifications of the memory device and/or standards (e.g., JEDEC) in some applications. Any applicable specifications and/or standards will be referred to herein collectively, as a standard or the standard.

Some memory devices may permit postponement of refresh operations for a certain period of time. For example, a memory device may not require that refresh commands be provided at regular intervals but that a certain number of refresh commands be provided within a certain period of time specified by a refresh period (tREFP). The tREFP may indicate a maximum period of time (e.g., time window) for which refresh operations may be postponed. In some applications, the number of refresh commands and/or tREFP may be based on a data retention characteristic of the memory device (e.g., an expected rate of data degradation of memory cells). Thus, one or more refresh commands may be postponed and issued at intervals shorter than tREFI at a later time to maintain the number of refresh commands within tREFP. Optionally, the number of refresh commands and/or the refresh period may be defined by the standard in some applications.

However, while tREFI and/or tREFP may be defined by the standard in some cases, there are no standards as to what a memory device will do when the tREFI and/or tREFP requirements are not met. This can lead to unpredictability for external devices that interact with the memory. If the memory does not respond in a known manner to a violation of tREFI and/or tREFP, data integrity may be compromised and/or the external device may not be able to take actions in order to regain compliance with refresh operation requirements.

Figure 1:
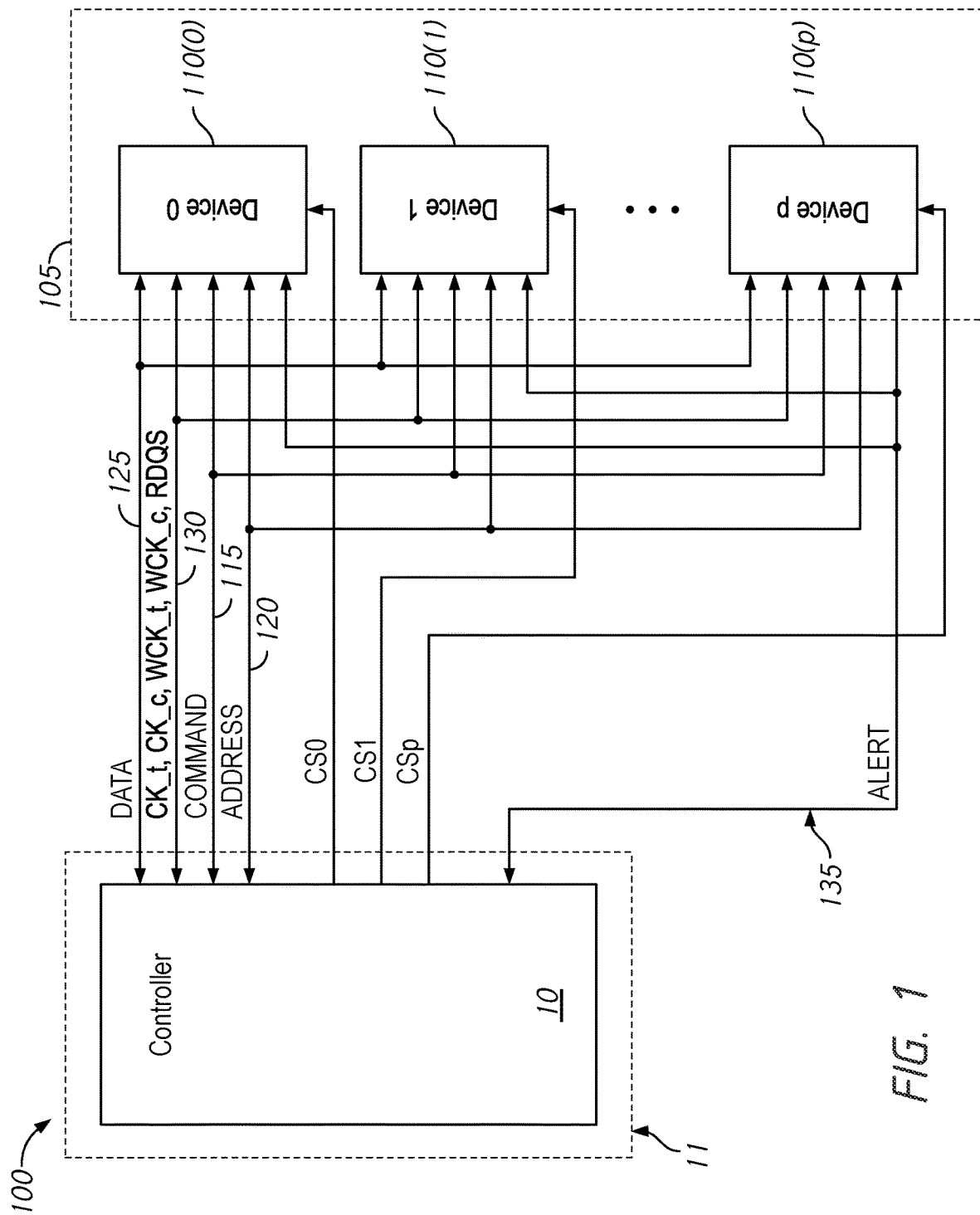
FIG. 1 is a block diagram of a system according to an embodiment of the disclosure.

FIG. 1 is a block diagram of a system 100 according to an embodiment of the disclosure. The system 100 includes a controller 10 and a memory system 105. In some embodiments, the controller may be included in a host device 11. The host device 11 may further include a processor and/or a computing system (not shown) in some embodiments. The memory system 105 includes memories 110(0)-110(p) (e.g., "Device 0" through "Device p"), where p is a non-zero whole number. However, in some embodiments, memory system 105 may include a single memory 110 (e.g., memory 110(0)). The memories 110(0)-110(p) may each include a memory array (not shown in FIG. 1) of memory cells for storing data. The memories 110(0)-110(p) are each coupled to command, address, data, clock, and alert busses. In some embodiments of the disclosure the memories 110(0)-110(p) are organized as ranks of memory. In such embodiments, the memories may be accessed by the ranks of memory. The controller 10 and the memory system 105 are in communication over several busses. For example, commands and addresses are received by the memory system 105 on a command bus 115 and an address bus 120, respectively, and data is provided between the controller 10 and the memory system 105 over a data bus 125. Various clock signals may be provided between the controller and memory system 105 over a clock bus 130. The clock bus 130 may include signal lines for providing system clock signals CK_t and CK_c received by the memory system 105, data clock signals WCK_t, and WCK_c received by the memory system 105 and an access data clock signal RDQS provided by the memory system 105 to the controller 10. Various alerts, some of which will be described herein, may be provided by the memory system 105 to the controller 10 on alert bus 135. Each of the busses may include one or more signal lines on which signals are provided.

The CK_t and CK_c signals provided by the controller 10 to the memory system 105 are used for timing the provision and receipt of the commands and addresses. The WCK_t and WCK_c signals and the RDQS signal are used for timing the provision of data. The CK_t and CK_c signals are complementary and the WCK_t and WCK_c signals are complementary. Clock signals are complementary when a rising edge of a first clock signal occurs at the same time as a falling edge of a second clock signal, and when a rising edge of the second clock signal occurs at the same time as a falling edge of the first clock signal. The WCK_t and WCK_c signals provided by the controller 10 to the memory system 105 may be synchronized to the CK_t and CK_c signals also provided by the controller 10 to the memory system 105. Additionally, the WCK_t and WCK_c clock signals may have a higher clock frequency than the CK_t and CK_c signals.

The controller 10 provides commands to the memory system 105 to perform memory operations. Non-limiting examples of memory commands include timing commands for controlling the timing of various operations, access commands for accessing the memory, such as read commands for performing read operations and write commands for performing write operations, refresh commands for refreshing memory cells of memory arrays, mode register write and read commands for performing mode register write and read operations, as well as other commands and operations. The command signals provided by the controller 10 to the memory system 105 further include select signals (e.g., chip select CS signals CS0, CS1, CSp). While all of the memories 110 are provided the commands, addresses, data, and clock signals, the select signals provided on respective select signal lines are used to select which one or more of the memories 110 will respond to the command and perform the corresponding operation. In some embodiments of the disclosure, a respective select signal is provided to each memory 110 of the memory system 105. The controller 10 provides an active select signal to select the corresponding memory 110. While the respective select signal is active, the corresponding memory 110 is selected to receive to the commands and addresses provided on the command and address busses 115 and 120.

In operation, when a read command and associated address are provided by the controller 10 to the memory system 105, the memory 110 selected by the select signals receives the read command and associated addresses, and performs a read operation to provide the controller 10 with read data from a memory location corresponding to the corresponding addresses. In preparation of the selected memory 110 providing the read data to the controller 10, the controller provides active WCK_t and WCK_c signals to the memory system 105. The WCK_t and WCK_c signals may be used by the selected memory 110 to generate an access data clock signal RDQS. A clock signal is active when the clock signal transitions between low and high clock levels periodically. Conversely, a clock signal is inactive when the clock signal maintains a constant clock level and does not transition periodically. The RDQS signal is provided by the memory 110 performing the read operation to the controller 10 for timing the provision of read data to the controller 10.

In operation, when a write command and associated address are provided by the controller 10 to the memory system 105, the memory 110 selected by the select signals receives the write command and associated addresses, and performs a write operation to write data from the controller 10 to a memory location corresponding to the corresponding addresses. In preparation of the selected memory 110 receiving the write data from the controller 10, the controller provides active WCK_t and WCK_c signals to the memory system 105. The WCK_t and WCK_c signals may be used by the selected memory 110 to generate internal clock signals for timing the operation of circuits to receive the write data. The data is provided by the controller 10 and the selected memory 110 receives the write data, which is written to memory corresponding to the memory addresses.

In operation, the controller 10 may provide refresh commands on the command bus 115 to the memories 110(0)-110(p) along with activating the appropriate select signal(s) in order to cause the selected memories 110(0)-110(p) to perform refresh operations to refresh data stored in the corresponding memory arrays. The refresh commands may be issued by the controller 10 may be interspersed with other commands, such as read and write commands, at regular intervals (e.g., tREFI). However, the refresh commands may additionally or alternatively be provided at irregular intervals. For example, if a controller 10 receives a large number of requests from a processor (not shown) in a short period of time, the controller 10 may delay issuing refresh commands for a period of time in order to fulfill the requests of the processor. The controller 10 may then issue a number of refresh commands to selected memories 110(0)-110(p) at a frequency greater than tREFI to "catch up" on refreshing data stored in the selected memories 110(0)-110(p). Catching up may include issuing a number of refresh commands that allows the controller 10 comply with tREFP. In some embodiments, the controller 10 may catch up by issuing a series of sequential refresh commands with no other intervening command types. The controller 10 may also issue a command to cause the selected memories 110(0)-110(p) to enter a self-refresh mode which causes the selected memories 110(0)-110(p) to perform periodic refresh operations without additional refresh commands received from the controller 10 until the controller 10 issues a subsequent command to exit the self-refresh mode.

Various aspects of the interactions between the controller 10 and memory system 105 may be defined by a standard. If controller 10 provides inputs complying with the standard, the memory system 105 performs operations and/or provides outputs complying with the standard in a properly operating system 100. Compliance with the standard may allow controllers and memories to act in a predictable manner. For example, compliance may help ensure the proper data is written to the memories 110(0)-110(p) and the proper data is read from the memories 110(0)-110(p). Timing requirements for the controller 10 issuing refresh commands to the memories 110(0)-110(p) of the memory system 105 (e.g., tREFI, tREFP, maximum number of postponed refresh commands) may be defined by a standard. Compliance with these refresh parameters may ensure the integrity of the data stored in the memories 110(0)-110(p).

During normal memory operations, the controller 10 may comply with the refresh requirements of the memory system 105. However, in some cases, the controller 10 may "fall out" of compliance, for example, by not issuing enough refresh commands within tREFP. Non-compliance may be unintentional, such as an error by a programmer of the controller 10 or electrical interference on the command bus 115. However, non-compliance may also be intentional, such as when refresh commands issued by the controller 10 are inhibited to cause a refresh starvation condition, as described in U.S. Pat. No. 10,192,608, which is incorporated herein by reference for any purpose.

Typically, when the controller 10 falls out of compliance with the standard, the memory system 105 no longer responds in a predictable manner. For example, memories 110(0)-110(p) may or may not properly execute commands and/or store data. This unpredictable behavior may compromise data integrity. In some applications, the unpredictable behavior may prevent the controller 10 from regaining control of the memory system 105 once the conditions causing non-compliance are corrected (e.g., dissipation of electrical interference, warding off attack), which may cause a failure of system 100.

According to embodiments of the present disclosure, memory system 105 and/or individual ones of the memories 110(0)-110(p) may include features that provide for refresh compliance. For example, memories 110(0)-110(p) may include circuitry that monitors the refresh commands received from controller 10. When the refresh commands are not provided in compliance with the standard (e.g., tREFI and/or tREFP is violated), the affected memory 110(0)-110(p) may stop executing (e.g., ignore, stop responding to) access commands (e.g., ACT) received from the controller 10. This may block the controller 10 from accessing at least a portion of the memory array, such as activating word lines in the memory and/or reading/writing data in the memory. This condition may be referred to as an "activation block" or "lockout."

In some embodiments, the affected memory 110(0)-110(p) may provide a signal alerting the controller 10 or another component of system 100 that memory refresh is not in compliance with requirements, for example, by providing an active alert signal on the alert bus 135. According to embodiments of the present disclosure, the controller 10 may end the lockout of the memories 110(0)-110(p) after a period of noncompliance by performing one or more actions (e.g., issuing a command). This may or may not be performed by the controller 10 responsive to the alert signal. For example, in some embodiments, the controller 10 may determine the memories 110(0)-110(p) are not responding to access commands, and the controller 10 may perform actions to end the lockout may be responsive to this determination. In some embodiments, the procedure for regaining access may be specified by the standard.

In some embodiments, the controller 10 may issue a number of refresh commands, and the effected memory 110(0)-110(p) may again respond to access commands after executing refresh operations corresponding to the received refresh commands. In some embodiments, the number of refresh commands required for the controller 10 to regain access may be equal to a number of the maximum permitted postponed refresh commands by the standard. In some embodiments, the number of refresh commands required may be twice the number of the maximum permitted postponed refresh commands. In some embodiments, the controller 10 may issue a number of refresh commands sufficient to refresh the entire memory 110(0)-110(p) (e.g., 8k refresh commands). If, after ending the lockout, the controller 10 once again falls out of compliance, the effected memory 110(0)-110(p) may again lockout the controller 10.

In some embodiments, when a memory 110(0)-110(p) detects noncompliance for refresh commands from the controller 10, the effected memory 110(0)-110(p) may enter a self-refresh mode. In some embodiments, the controller 10 may end the lockout by issuing a command to exit the self-refresh mode. In some embodiments, the memory 110(0)-110(p) may not end the lockout until a period of time sufficient for the self-refresh mode to refresh the entire memory has elapsed.

In embodiments where memories 110(0)-110(p) include row hammer mitigation features, when noncompliance for refresh commands from the controller 10 is detected, the effected memory 110(0)-110(p) may refresh victim word lines determined by the row hammer mitigation features. In some embodiments, the memories 110(0)-110(p) may refresh victim word lines in addition to performing self-refresh operations. Servicing victim rows and/or refreshing via self-refresh operations may improve data integrity. In some embodiments, even if the controller 10 has issued the required number of refresh commands, the memory 110(0)-110(p) may not end the lockout until all victim rows have been refreshed.

In some embodiments, the action or actions taken by the memories 110(0)-110(p) during the lockout may vary depending on the command history of the controller 10. For example, an action taken by the memories 110(0)-110(p) may be different when the controller 10 provides no commands than an action taken when the controller 10 provides a series of access commands without sufficient refresh commands. For example, if the controller 10 provides no commands for a period of times, in some embodiments, the memories 110(0)-110(p) may enter a self-refresh mode and may end the lockout when the controller 10 provides a command to exit the self-refresh mode, but if the controller 10 provides a series of access commands without the required number of refresh commands, in some embodiments, the memories 110(0)-110(p) may enter a self-refresh mode and may not end the lockout until the entire memory array has been refreshed.

The controller 10 and/or memory system 100 may perform one or more training and/or initialization procedures prior to commencing "ordinary" operations, such as synchronizing clock signals, ZQ calibration, command bus training, and data bus training. Initialization may occur, for example, upon power-up of the system 100. Initialization, including data bus training, may not require access to the memory array. In some embodiments, the controller 10 may not provide any access and/or refresh commands during normal initialization. For example, the controller 10 may issue multipurpose commands (MPC) and utilize circuitry (e.g., flip-flops) other than the memory array for initialization.

In some embodiments, the memories 110(0)-110(p) may default to ignoring access commands during the initialization. After initialization is complete, the controller 10 may issue a mode register write command to the memories 110(0)-110(p) and write a value to the mode register of each of the memories 110(0)-110(p). The value may indicate completion of the initialization. Responsive to the value stored in the mode register, the memories 110(0)-110(p) may begin executing (e.g., responding to) access commands issued by the controller 10. The value written to the mode register may also cause the memories 110(0)-110(p) to begin monitoring refresh commands for compliance with the standard. In some embodiments, not enforcing refresh command compliance during initialization may reduce the risk of an unintentional lockout.

Figure 2:
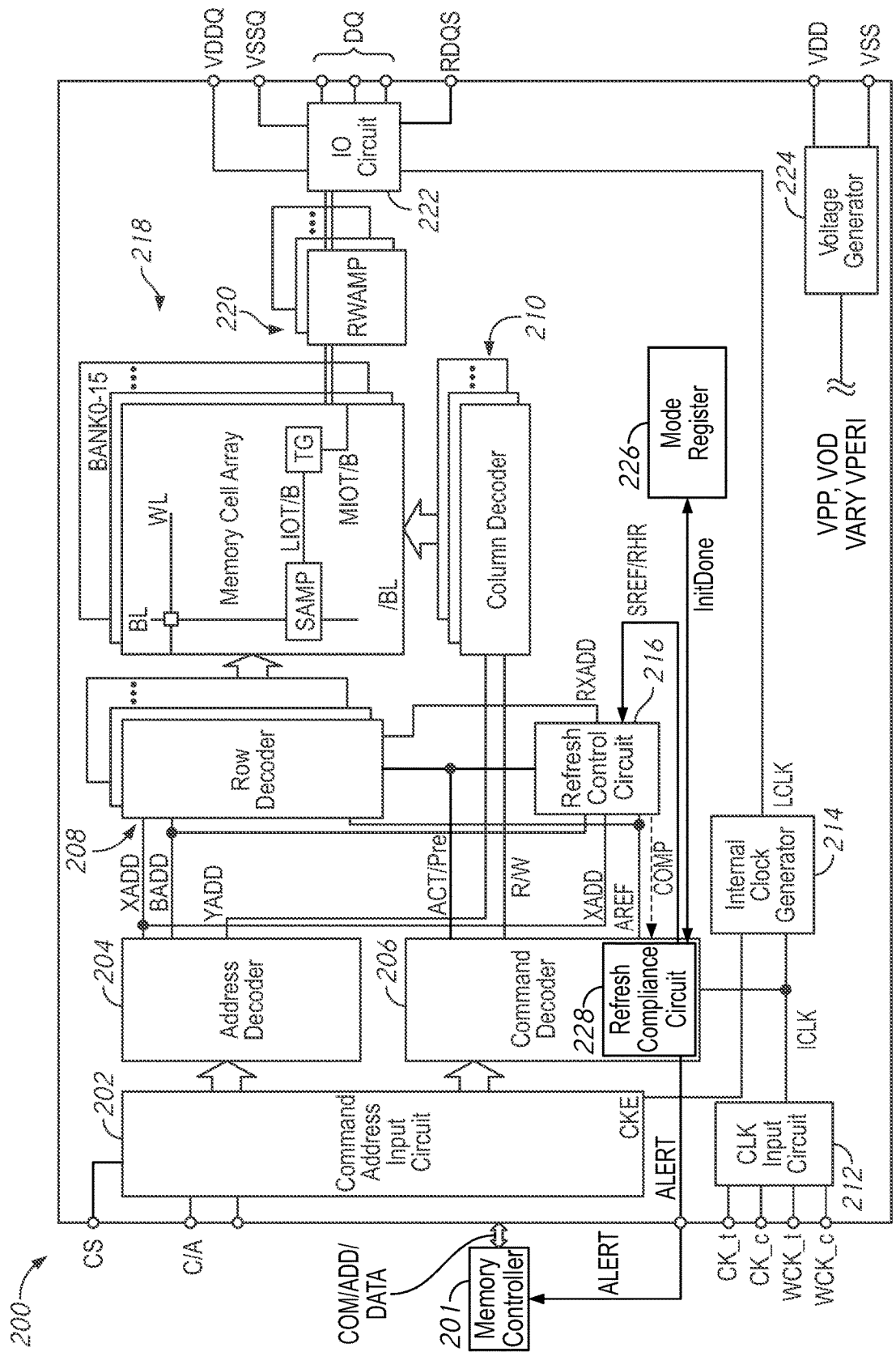
FIG. 2 is a block diagram of a semiconductor device according an embodiment of the disclosure.

FIG. 2 is a block diagram of a semiconductor device according an embodiment of the disclosure. The semiconductor device 200 may be a semiconductor memory device, such as a DRAM device integrated on a single semiconductor chip. For context, a memory controller 201 is also shown. In some embodiments, semiconductor device 200 may be included in one or more of memories 110(0)-110(p). In some embodiments, controller 201 may be included in controller 10.

The semiconductor device 200 includes a memory array 218. The memory array 218 is shown as including a plurality of memory banks. In the embodiment of FIG. 2, the memory array 218 is shown as including sixteen memory banks BANK0-BANK15. More or fewer banks may be included in the memory array 218 of other embodiments. Each memory bank includes a plurality of word lines WL, a plurality of bit lines BL and/BL, and a plurality of memory cells MC arranged at intersections of the plurality of word lines WL and the plurality of bit lines BL and/BL. The selection of the word line WL is performed by a row decoder circuit 208 and the selection of the bit lines BL and/BL is performed by a column decoder circuit 210. In the embodiment of FIG. 2, the row decoder circuit 208 includes a respective row decoder circuit for each memory bank and the column decoder circuit 210 includes a respective column decoder for each memory bank. The bit lines BL and/BL are coupled to a respective sense amplifier (SAMP). Read data from the bit line BL or/BL is amplified by the sense amplifier SAMP, and transferred to read/write amplifiers 220 over complementary local data lines (LIOT/B), transfer gate (TG), and complementary main data lines (MIOT/B). Conversely, write data outputted from the read/write amplifiers 220 is transferred to the sense amplifier SAMP over the complementary main data lines MIOT/B, the transfer gate TG, and the complementary local data lines LIOT/B, and written in the memory cell MC coupled to the bit line BL or/BL.

The semiconductor device 200 may employ a plurality of external terminals that include command and address (C/A) terminals coupled to a command and address bus to receive commands and addresses, and a CS signal, clock terminals to receive clocks CK_t CK_c, WCK_t, and WCK_c to provide data clock RDQS, data terminals DQ to provide data, and power supply terminals to receive power supply potentials VDD, VSS, VDDQ, and VSSQ.

The clock terminals are supplied with external clocks CK_t, CK_c, WCK_t, and WCK_c that are provided to an input circuit 212. The external clocks may be complementary. The input circuit 212 generates internal clock signals based on the internal clock signals such as internal clock ICLK based on the CK_t and CK_c clocks. The ICLK clock is provided to the command decoder circuit 210 and to an internal clock generator 214. The internal clock generator 214 provides various internal clocks LCLK based on the ICLK clock. The LCLK clocks may be used for timing operation of various internal circuits. The internal data clocks LCLK are provided to the input/output circuit 222 to time operation of circuits included in the input/output circuit 222, for example, to data receivers to time the receipt of write data.

The C/A terminals may be supplied with memory addresses. The memory addresses supplied to the C/A terminals are transferred, via a command/address input circuit 202, to an address decoder 204. The address decoder 204 receives the address and supplies a decoded row address XADD to the row decoder circuit 208 and supplies a decoded column address YADD to the column decoder circuit 210. The address decoder 204 may also supply a decoded bank address BADD, which may indicate the bank of the memory array 218 containing the decoded row address XADD and column address YADD. The C/A terminals may be supplied with commands. Examples of commands include access commands for accessing the memory, such as commands for performing read operations and commands for performing write operations. Other examples of commands include mode register read and write commands, which may be used to read and write data from a mode register 226. The access commands may be associated with one or more of a row address XADD, column address YADD, and/or bank address BADD to indicate the memory cell(s) to be accessed. In some embodiments, the commands and/or addresses may be provided by a component external to the device 200, for example, as shown in FIG. 2, a memory controller 201 in communication with the device 200.

The commands may be provided as internal command signals to a command decoder circuit 206 via the command/address input circuit 202. The command decoder circuit 206 includes circuits to decode the internal command signals to generate various internal signals and commands for performing operations. For example, the command decoder circuit 206 may provide a row command signal ACT to select a word line and a column command signal R/W to select a bit line.

The device 200 may receive a command for writing one or more values to a mode register 226. The values in the mode register 226 may define modes of operation of the device 200. For example, the values in the mode register 226 may indicate burst length, frequency, CAS latency, enablement of write data copy operations, etc. In some embodiments, the memory controller 201 may provide the mode register write command and an address provided with the mode register write command may indicate a register within the mode register 226 to be written to and the value to be written to the register. In some embodiments, such as the one shown in FIG. 2, the command decoder 206 may write the value to the indicated register of the mode register 226. In other embodiments, the address decoder circuit 204 may provide the value to be written to the mode register 226. In other embodiments, the command address input circuit 202 may write the value to the indicated register of the mode register 226.

The device 200 may receive access commands for performing read operations. When the commands are received, and a bank address, a row address and a column address are timely supplied with the commands, read data is read from memory cells in the memory array 218 corresponding to the row address and column address. The commands are received by the command decoder circuit 206, which provides internal commands so that read data from the memory array 218 is provided to the read/write amplifiers 220. The read data is output to outside from the data terminals DQ via the input/output circuit 222.

The device 200 may receive access commands for performing write operations. When the commands are received, and a bank address, a row address and a column address are timely supplied with the commands, write data supplied to the data terminals DQ is written to a memory cells in the memory array 218 corresponding to the row address and column address. The commands are received by the command decoder circuit 206, which provides internal commands so that the write data is received by data receivers in the input/output circuit 222. The write data is supplied via the input/output circuit 322 to the read/write amplifiers 220, and by the read/write amplifiers 220 to the memory array 218 to be written into the memory cell MC.

The device 200 may also receive commands from the memory controller 201 causing it to carry out one or more refresh operations responsive to refresh commands or as part of a self-refresh mode. The device 200 may enter self-refresh mode responsive to a self-refresh mode command from the memory controller 201 and/or when refresh commands are not provided in compliance with a standard. The refresh signal AREF may be a pulse signal which is activated when the command decoder circuit 206 receives a signal which indicates a refresh command or an entry to the self-refresh mode. The refresh signal AREF may be activated once immediately after command input. In self-refresh mode, thereafter the refresh signal AREF may be cyclically activated at desired internal timing. The refresh signal AREF may be used to control the timing of refresh operations during the refresh mode. A self-refresh exit command provided by controller 201 may cause the automatic activation of the refresh signal AREF to stop and may cause the device 200 to return to an idle state and/or resume other operations.

The refresh signal AREF is supplied to the refresh control circuit 216. Responsive, at least in part, to the refresh signal AREF, the refresh control circuit 216 supplies a refresh row address RXADD to the row decoder circuit 208, which may refresh one or more word lines WL indicated by the refresh row address RXADD. The refresh control circuit 216 may control a timing of the refresh operation, and may generate and provide the refresh address RXADD. The refresh control circuit 216 may selectively output a targeted refresh address (e.g., which specifies one or more victim address based on an aggressor) or an automatic refresh address (e.g., from a sequence of auto refresh addresses) as the refresh address RXADD. Based on the type of refresh address RXADD, the row decoder circuit 208 may perform a targeted refresh or auto refresh operation.

The automatic refresh addresses may be from a sequence of addresses which are provided based on activations of the refresh signal AREF. The refresh control circuit 216 may cycle through the sequence of auto refresh addresses at a rate determined by AREF. In some embodiments, the auto refresh operations may generally occur with a timing such that the sequence of auto refresh addresses is cycled such that no information is expected to degrade in the time between auto refresh operations for a given word line. In other words, auto refresh operations may be performed such that each word line is refreshed at a rate faster than the expected rate of information decay.

The refresh control circuit 216 may determine targeted refresh addresses which are addresses that require refreshing (e.g., victim addresses corresponding to victim rows) based on the access pattern of nearby addresses (e.g., aggressor addresses corresponding to aggressor rows) in the memory array 218. An aggressor row may be a row that causes (or is suspected of causing) an increased rate (or suspected increased rate) of data degradation in one or more other rows, which are referred to as victim rows. Performing targeted refresh operations on victim rows may be referred to as servicing the victim rows.

The power supply terminals are supplied with power supply potentials VDD and VSS. The power supply potentials VDD and VSS are supplied to an internal voltage generator circuit 224. The internal voltage generator circuit 224 generates various internal potentials VPP, VOD, VARY, VPERI, and the like based on the power supply potentials VDD and VSS supplied to the power supply terminals. The internal potential VPP is mainly used in the row decoder circuit 208, the internal potentials VOD and VARY are mainly used in the sense amplifiers SAMP included in the memory array 218, and the internal potential VPERI is used in many peripheral circuit blocks.

The power supply terminals are also supplied with power supply potentials VDDQ and VSSQ. The power supply potentials VDDQ and VSSQ are supplied to the input/output circuit 222. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 222 so that power supply noise generated by the input/output circuit 222 does not propagate to the other circuit blocks.

In some embodiments, the memory controller 201 may be in communication with a processor, such as a central processing unit of a computing system (not shown). In other embodiments, the memory controller 201 may be integrated with the processor. The memory controller 201 may provide commands COM and/or addresses ADD to the C/A terminals of the device 200 and provide and receive data DATA via the DQ terminals of the device 200. In some embodiments, some of the commands and/or addresses provided by the memory controller 201 may be based on instructions provided by the processor. Some of the instructions provided by the processor may be based, at in part, on a program being executed by the processor (e.g., executable instructions stored on a non-transitory computer readable medium accessible to the processor, not shown). Some of the commands provided by the memory controller 201 may be generated internally by circuitry of the memory controller 201.

According to embodiments of the present disclosure, the device 200 may include a refresh compliance circuit 228. In the embodiment shown in FIG. 2, the refresh compliance circuit 228 is shown as part of the command decoder 206. However, in other embodiments, the refresh compliance circuit 228 may be included in the refresh control circuit 216 or as a separate circuit included in device 200. When enabled, the refresh compliance circuit 228 may monitor the commands received from the memory controller 201 to ensure refresh compliance (e.g., a sufficient number of refresh commands are provided in a period of time). In some embodiments, the refresh compliance circuit 228 may keep track of multiple command types (e.g., access, refresh), but in other embodiments, the refresh compliance circuit 228 may only keep track of refresh commands received from the controller 201.

When the refresh compliance circuit 228 determines that the memory controller 201 has failed to comply with one or more refresh requirements (e.g., tREFI, tREFP), which may be defined by a standard, the refresh compliance circuit 228 may cause the device 200 to no longer respond (e.g., ignore, stop executing) to access commands provided by the memory controller 201, creating a lockout condition. In some embodiments, the refresh compliance circuit 228 may cause the command decoder circuit 206 to no longer issue the ACT command. In some embodiments, the refresh compliance circuit 228 may mask the ACT command provided by the command decoder circuit 206 to the row decoder circuit 208, preventing activation of a word line of the memory cell array 218. This may prevent the controller 201 from reading data from the memory array 218, writing data to the memory array 218, and/or otherwise activating word lines of the memory array 218.

In some embodiments, in addition to locking out the controller 201 from accessing the memory array 218, the refresh compliance circuit 228 may take one or more other actions. In some embodiments, responsive to determining the controller 201 is not in compliance, the compliance circuit 228 may activate an alert signal ALERT and provide the active alert signal via an external alert terminal. The memory controller 201 may receive the ALERT via the external terminal in some embodiments. In some embodiments, the refresh compliance circuit 228 may provide signals SREF/RHR to the refresh control circuit 216 to cause the refresh control circuit 216 to enter a self-refresh mode and/or perform targeted refresh operations. In embodiments where the refresh compliance circuit 228 monitors multiple command types, the action or actions taken by refresh compliance circuit 228 during the lockout may depend, at least in part, by a pattern of commands received from the controller 201.

During the lockout, the refresh compliance circuit 228 may continue to monitor commands received by the controller 201. If the refresh compliance circuit 228 determines that the controller 201 has regained compliance with the refresh requirements (e.g., issue the full number of permitted postponed refresh commands) or has issued the appropriate commands to end the lockout (e.g., issue an exit self-refresh command, issue a number of refresh commands sufficient to refresh the entire memory array 218), the refresh compliance circuit 228 may cause the device 200 to respond to access commands issued by the controller 201. In some embodiments, the refresh compliance circuit 228 may not end the lockout until a period of time has passed. For example, the refresh compliance circuit 228 may wait for a period of time sufficient to allow all victim rows to be refreshed and/or allow a self-refresh mode to refresh the entire memory array 218 prior to ending the lockout responsive to a self-refresh exit command. Additionally or alternatively, the refresh control circuit 216 may provide a signal COMP to the refresh compliance circuit indicating the completion of refreshing all victim rows and/or memory array 218. In some embodiments, the actions taken by the controller 201 and/or the delay may be defined by the standard.

In some embodiments, the refresh compliance circuit 228 may be enabled by an active InitDone signal provided by the mode register 226. In some embodiments, the mode register 226 may provide the active InitDone signal responsive to a value being written to the mode register 226. The value may be written to the mode register 226 responsive to a mode register write command provided by the memory controller 201. The value may indicate that an initialization performed by the controller 201 and/or device 200 is complete.

In some embodiments, the refresh compliance circuit 228 may not monitor and/or take action responsive to commands received from the memory controller 201 when disabled (e.g., receiving an inactive InitDone signal). That is, compliance with refresh requirements may not be enforced when the refresh compliance circuit 228 is disabled. This may reduce a risk of an unintentional lockout during initialization when the controller 201 does not ordinarily provide refresh commands to the device 200.

In some embodiments, when disabled, the refresh compliance circuit 228 and/or inactive InitDone signal may cause the device 200 to ignore (e.g., not respond to, not execute) access commands issued by the controller 201. However, unlike when a lockout condition exists, the controller 201 may not be required to issue refresh commands, an exit self-refresh command, and/or wait a delay period to regain access to the memory array. Instead, when the refresh compliance circuit 228 is disabled, the controller 201 may provide the mode register write command to write the value to the mode register 226 to provide the active InitDone signal to gain access to the memory array. In some embodiments, writing to the mode register may allow access to the memory array 218 by the controller with fewer commands issued and/or less time delay. Once enabled by the active InitDone signal, the refresh compliance circuit 228 will begin refresh compliance enforcement.

Although writing a value to a mode register to set the state of the InitDone signal is disclosed in the context of enabling and disabling the refresh compliance circuit 228, this feature is not limited to these examples. In some embodiments (not shown), a semiconductor device that does not include a refresh compliance circuit may include a mode register, and a value written to the mode register by the controller may activate the InitDone signal. In these embodiments, the InitDone signal may cause the device to ignore access commands issued by the controller until the controller issues a mode register write command to write the value to the register to activate the InitDone signal. In some embodiments, this may cause the device to ignore access commands during initialization, but respond to access commands once the controller indicates initialization is complete. In some applications, ignoring access commands until after initialization may protect against unauthorized and/or incorrect access to the memory array which may cause errors and/or improper initialization of the device.

Figure 3:
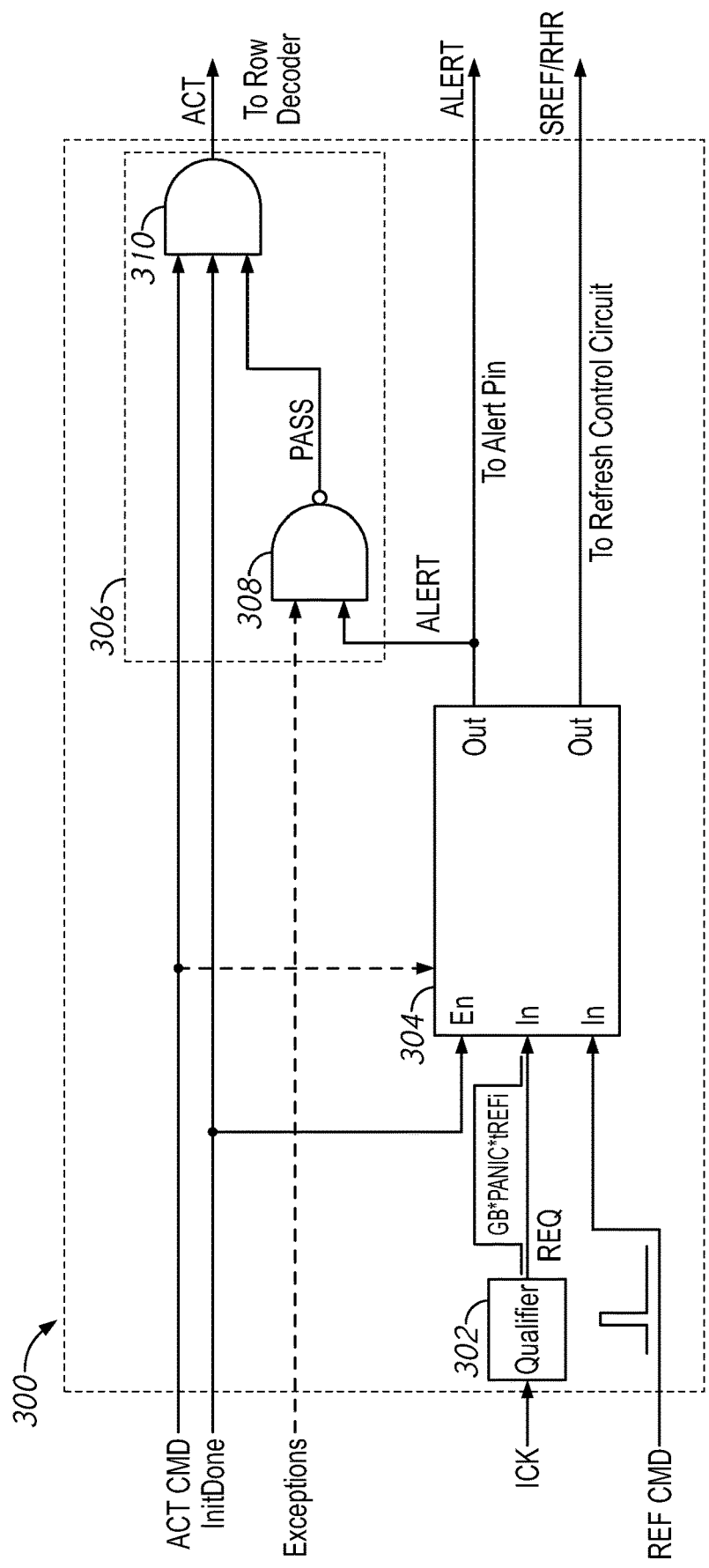
FIG. 3 is a functional block diagram of a refresh compliance circuit according to at least one embodiment of the disclosure.

FIG. 3 is a functional block diagram of a refresh compliance circuit according to at least one embodiment of the disclosure. In some embodiments, the refresh compliance circuit 300 may be included in refresh compliance circuit 228.

The refresh compliance circuit 300 may receive an activation command signal ACT CMD associated with an access command and refresh command signal REF CMD. The activation and/or refresh command signals may be provided directly from a memory controller such as controller 10 and/or controller 201, or may be provided by way of a command address input circuit and/or command decoder, such as command address input circuit 202 and command decoder 206. The refresh compliance circuit 300 may receive an initialization done signal InitDone from a mode register, such as mode register 226. The refresh compliance circuit 300 may further receive a clock signal ICK. In some embodiments, the clock signal may be provided by a clock input circuit, such as clock input circuit 212. However, in other embodiments, the refresh compliance circuit 300 may receive an internal clock signal LCLK provided by an internal clock generator, such as internal clock generator 214.

The refresh compliance circuit 300 may provide an internal activation signal ACT which may be provided to a row decoder, such as row decoder 208. The refresh compliance circuit 300 may provide an alert signal ALERT to an external terminal of a memory device, such as alert terminal of device 200. The refresh compliance circuit 300 may also provide control signals to a refresh control circuit, such as refresh control circuit 216. Example control signals include a self-refresh signal SREF and a targeted refresh signal RHR. An active SREF signal may cause the refresh control circuit to enter a self-refresh mode. An active RHR signal may cause the refresh control circuit to refresh victim rows. Other and/or additional control signals may be provided to the refresh control circuit in other embodiments.

The refresh compliance circuit 300 may include a qualifier circuit 302. The qualifier circuit 302 may receive the clock signal ICK and based on the clock signal, generate a requirement signal REQ. The requirement signal REQ may be a pulse signal, where a duration of the pulse may be based, at least in part, on one or more refresh command requirements, which may be defined by a standard. For example, the width of the REQ pulse may be equal to tREFI, tREFP, and/or other refresh command timing requirements. In the example shown in FIG. 3, the width of REQ pulse is equal to tREFI multiplied by a number of permitted postponed refresh commands (PANIC) multiplied by a guard band (GB). The number of permitted postponed refresh commands, similar to tREFI, may be defined by the standard in some embodiments. The guard band may be a constant that provides an extra amount of time to allow for some deviation from refresh command requirements. Example values of GB include 1.5, 1.75, and 2. However, if tight compliance is desired, GB may be omitted or set to 1 in some embodiments. In another example, the qualifier circuit 302 may provide a pulse signal with a frequency of tREFI, tREFP, and/or other refresh command timing requirement.

The refresh compliance circuit 300 may include a compliance detection circuit 304. The compliance detection circuit 304 may receive the REQ signal and refresh commands as represented by the refresh command signal REF CMD. When enabled by an active InitDone signal, the compliance detection circuit 304 may count a number of refresh commands received and confirm a sufficient number are received within a time period indicated by the pulse width of the REQ signal and/or a frequency of the REQ signal. The compliance detection circuit 304 may provide the alert signal and control signals to the refresh control circuit. The compliance detection circuit 304 may provide the ALERT signal and/or control signals in one state when it determines refresh commands are provided in compliance with the standard and another state when the refresh commands are not being provided in compliance with the standard (e.g., too many postponed refresh commands, violation of tREFP).

In some embodiments, the response to a determination of noncompliance may be the same, regardless of any action or inaction of the controller. For example, the control signal(s) provided to the refresh control circuit by the compliance detection circuit 304 may always be the same (e.g., always SREF, always RHR, or a combination thereof) and/or other actions taken by the compliance detection circuit 304 may be the same. However, in other embodiments, the response may vary based on interactions (or lack thereof) between the memory device and the controller. For example, the control signal provided by the compliance detection circuit 304 may vary based, at least in part, on a pattern of commands received from the controller. In the example shown in FIG. 3, the compliance detection circuit 304 may optionally monitor the ACT CMD signal. The compliance detection circuit 304 may count a number of activation commands received within a period of time. If the number of refresh commands received within the active period of the REQ signal is insufficient, and few or no activation commands have been received, the compliance detection circuit 304 may provide the SREF signal to the refresh control signal. On the other hand, if the number of activation commands was high (e.g., equal to or above a threshold value), the compliance detection circuit 304 may provide the RHR signal and require the controller to issue a number of refresh commands sufficient to refresh the entire memory array (e.g., 8K). In another example, the compliance detection circuit 304 may always provide the SREF signal to the refresh control circuit, but implement a delay sufficient for the SREF mode to refresh the entire array prior to responding to a controller's return to refresh compliance (e.g., issuing an exit SREF command).

Other differences in responses by the compliance detection circuit 304 may be performed in other embodiments. Furthermore, the difference in responses need not be based on other command types. For example, if the controller issues a number of allowed postponed refresh commands, the compliance detection circuit 304 may end the lockout when the controller returns to compliance, but may reduce the time for compliance by reducing a number of allowed postponed refresh commands by half (e.g., by reducing tREFP) until the controller has issued at least double the number of postponed refresh commands.

The refresh compliance circuit 300 may include a lockout circuit 306 that causes the memory device to ignore (e.g., not respond to, not execute) access commands provided by the controller, causing the controller to lose access to the memory array (e.g., be locked out from the memory array). In the example shown in FIG. 3, the lockout circuit 306 includes logic that prevents an internal activation signal ACT from transitioning to an active state responsive to an activate command ACT CMD to lockout the controller from the memory array. The lockout circuit 306 may receive the ACT CMD, InitDone, and PASS signals at an AND logic circuit 310. When all three signals are active, the internal ACT command may transition to an active state, permitting the memory device to respond to an access command. However, if any of the signals are inactive, the ACT signal will be inactive.

Optionally, as shown in FIG. 3, the lockout circuit 306 may receive the ALERT signal and an exceptions signal at a NAND logic circuit 308 and output a pass signal PASS. The exceptions signal may be generated by a fuse, anti-fuse, test probe, and/or other circuit used during sample testing, debugging, and/or other procedures where refresh compliance may be purposely violated. In these embodiments, when the exceptions signal is set to a logic low, PASS may remain active high, regardless of the state of the ALERT signal. This may allow the controller to access the memory array during testing or other conditions when refresh operations may not be utilized. When the exceptions signal is set high, the ALERT signal may be inverted. Thus, when the ALERT signal is inactive, the NAND logic circuit 308 provides an active PASS signal, and when the ALERT signal is active (e.g., noncompliance has been determined by the compliance circuit 304), the NAND logic circuit 308 provides an inactive PASS signal. However, in embodiments where there are no exceptions, the NAND logic circuit 308 may be replaced by an inverter logic gate.

In operation, InitDone may be in an inactive state until an initialization operation has been completed. Thus, the ACT signal may be kept inactive before and during initialization, regardless of the state of the ACT CMD and PASS signals. After initialization is complete and InitDone is activated, the ACT signal will be active when both ACT CMD and PASS are active. If ACT CMD is activated, ACT will be active when the PASS signal is also active (e.g., controller determined to be in refresh compliance). Thus the ACT signal is only active after initialization and when the controller is in refresh compliance. The specific logic circuitry of the lockout circuit 306 is provided merely as an example, and other logic circuitry may be used in other examples.

Figure 4:
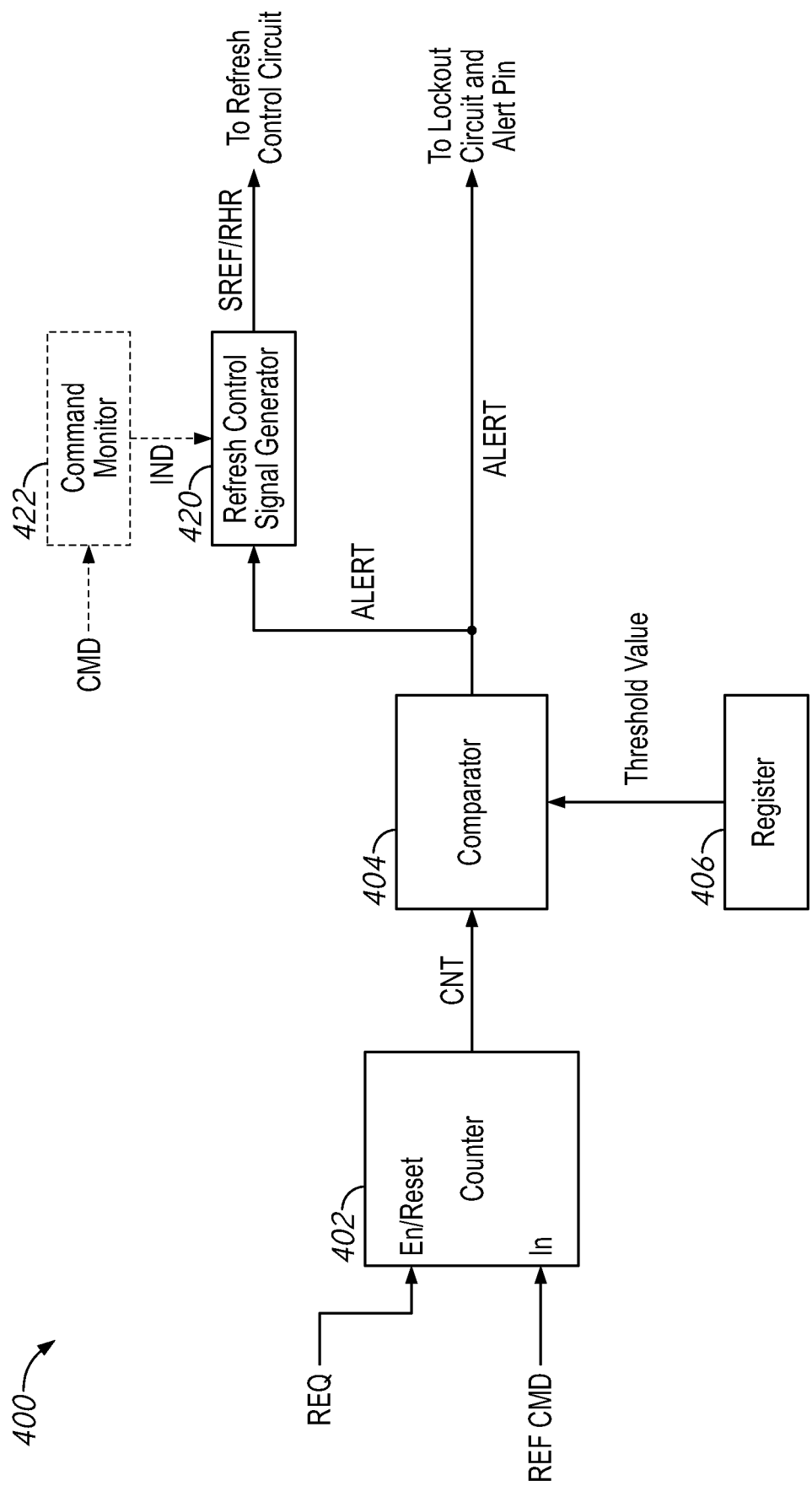
FIG. 4 is a block diagram showing at least a portion of a compliance detection circuit in accordance with at least one embodiment of the disclosure.

FIG. 4 is a block diagram showing at least a portion of a compliance detection circuit in accordance with at least one embodiment of the disclosure. The compliance detection circuit 400 may be included in compliance detection circuit 304 of FIG. 3 in some embodiments.

The compliance detection circuit 400 may include a counter 402 that is enabled by an active REQ signal and increments each time REF CMD is received. When the REQ signal is deactivated, a count value CNT of the counter may be compared to a threshold value by a comparator 404. The threshold value may be stored in the comparator 404 and/or stored in a register 406 and provided to the comparator 404. Based on the comparison, the comparator 404 may determine whether or not the controller is in compliance (e.g., the controller is in compliance when the value is equal to or above the threshold value) and set the state of an ALERT signal accordingly. In some embodiments, the counter 402 may be reset and re-enabled by a subsequent reactivation of the REQ signal.

The ALERT signal may indicate whether the controller is in refresh compliance. For example, when active (e.g., set or a high logic level), the ALERT signal may indicate that the timing of refresh request commands provided by the controller has failed to meet the standard.

The ALERT signal may be provided to an external terminal, such as an alert terminal as shown in FIG. 1. The ALERT signal may also be provided to a lockout circuit, such as lockout circuit 306. The ALERT signal may further be provided to a refresh control signal generator circuit 420 of the compliance detector circuit 400. The ALERT signal may cause the refresh control signal generator circuit 420 to provide one or more control signals to a refresh control circuit, such as refresh control circuit 216. For example, the refresh control signal generator circuit 420 may provide a control signal to indicate entry into a self-refresh mode and/or that targeted refresh operations should be performed.

Optionally the compliance detection circuit 400 may further include a command monitor circuit 422. The command monitor circuit 422 may monitor other command types CMD, such as activation ACT commands, received from the controller. The command monitor circuit 422 may provide a signal to the refresh control signal generator circuit 420 based on patterns of the commands received. For example, in some embodiments, the command monitor circuit 422 may include a counter that increments each time a command or particular command type is received. The command monitor circuit 422 may provide an indication IND of whether a value of the counter is equal to or above a threshold value. The indication may alter what control signals the refresh control signal generator circuit 420 issues to the refresh control circuit. For example, when the ALERT signal is active and IND is active to indicate the counter is equal to or above the threshold value, the refresh control signal generator circuit 420 may issue an RHR signal, and when IND is inactive, the refresh control signal generator circuit 420 may issue an SREF signal. Other command monitoring techniques may be used in other examples.

The compliance detection circuit 400 is provided merely as an example, and other techniques for detecting compliance with refresh requirements may be used in other embodiments. For example, instead of counter 402, comparator 404, and register 406, a multi-stage circuit may be used, such as the multi-stage circuit shown in FIGS. 4A-E of U.S. Pat. No. 10,192,608.

Figure 5:
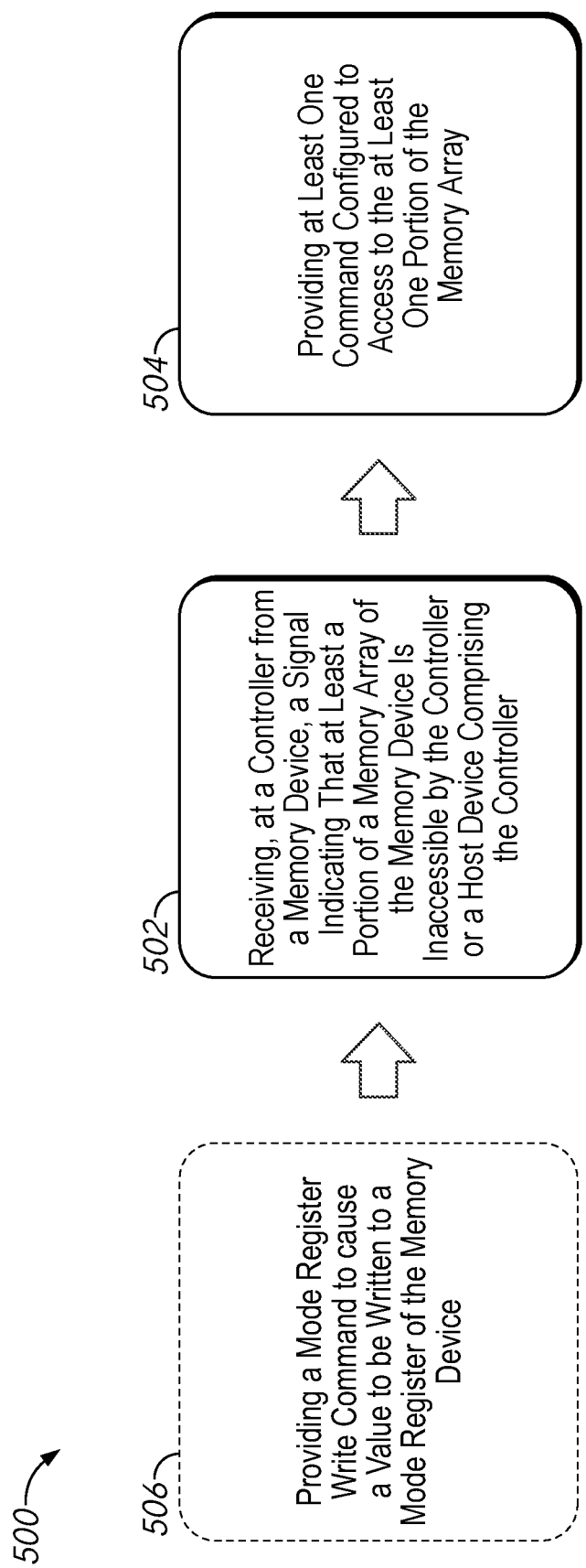
FIG. 5 is a flow chart of a method in accordance with at least one embodiment of the disclosure.

FIG. 5 is a flow chart of a method according to at least one embodiment of the disclosure. In some embodiments, the method 500 may be performed, at least in part, by a controller, such as controller 10 and/or controller 201.

At block 502 "receiving, at a controller from a memory device, a signal indicating that at least a portion of a memory array of the memory device is inaccessible by the controller or a host device comprising the controller" may be performed. The host device may be host device 11 in some embodiments. The memory device may be included in a memory system, such as memories 110(0)-110(p) of memory system 105 in some embodiments. In some embodiments, the memory device may be device 200. In some embodiments, the signal may be an alert signal provided by the memory device. In some embodiments, the signal may be responsive to the controller determining that the memory device failed to respond to an access command provided by the controller.

Responsive to receiving the signal, at block 504, "providing at least one command configured to access to the at least one portion of the memory array" may be performed. In some embodiments, the at least one command may include an exit self-refresh command. In some embodiments, the command may include one or more refresh commands. In some embodiments, a number of refresh commands provided may equal a number of postponed refresh commands—such as a number defined by a standard. In some embodiments, a number of refresh commands provided by the controller may be a number sufficient to refresh an entirety of the memory array (e.g., memory array 218) of the memory device (e.g., 8K commands).

Optionally, in some embodiments, method 500 may further include performing at block 506, "providing a mode register write command to cause a value to be written to a mode register of the memory device." In some embodiments, the value may indicate a status of an initialization. For example, the value may indicate when an initialization is complete. In some embodiments, block 506 is performed prior to block 502. However, block 506 may be performed concurrently or substantially concurrently with block 502 in some embodiments. In some embodiments, the refresh compliance features of the memory may be enabled by the value written to the mode register by the controller.

Figure 6:
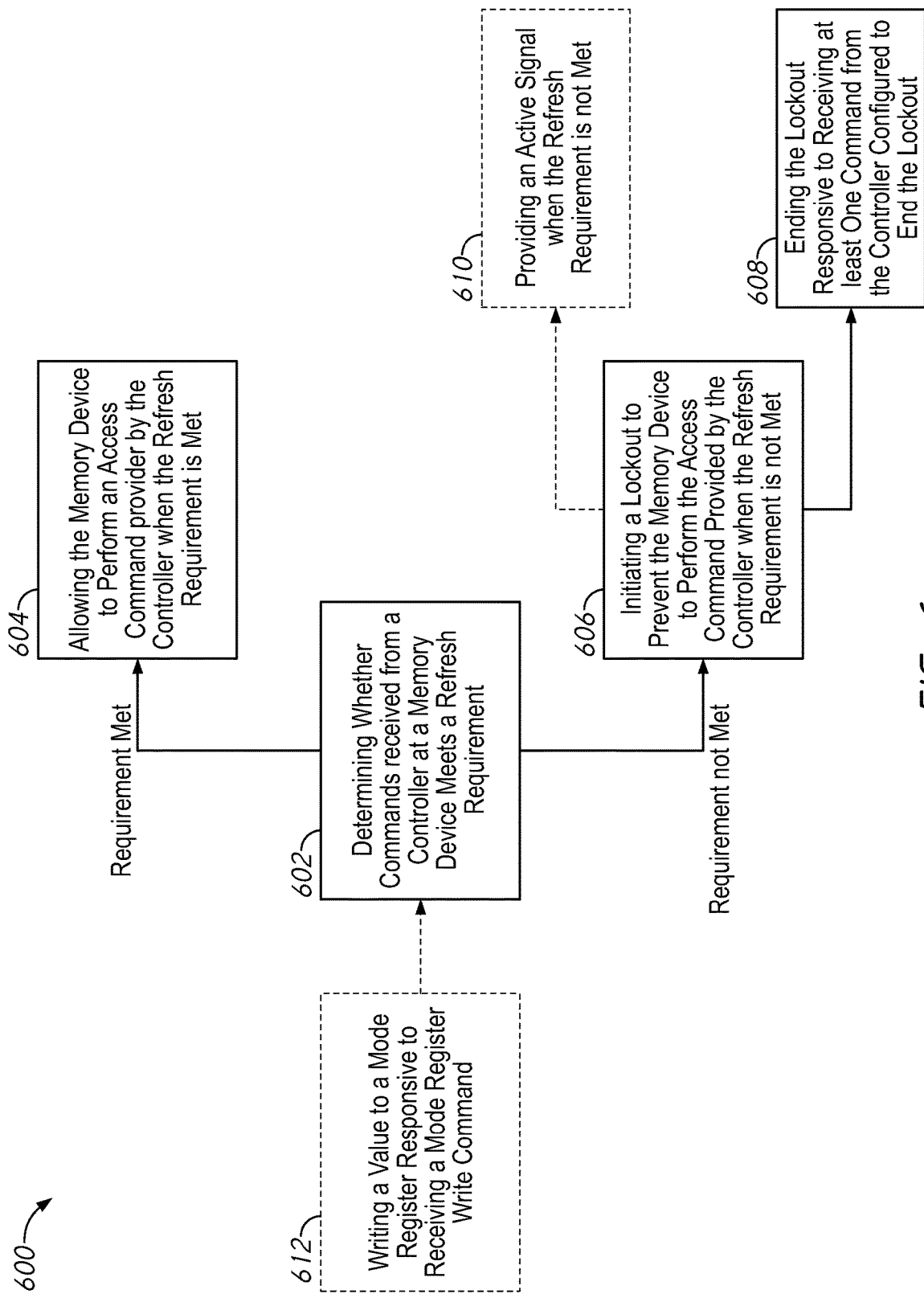
FIG. 6 is a flow chart of a method in accordance with at least one embodiment of the disclosure.

FIG. 6 is a flow chart of a method according to at least one embodiment of the disclosure. In some embodiments, the method 700 may be performed, at least in part, by a memory device, such as memories 110(0)-110(p) and/or device 200. In some embodiments, the method 600 may be performed, at least in part, by a refresh compliance circuit, such as refresh compliance circuit 228 and/or 300.

At block 602, "determining whether commands received from a controller at a memory device meets a refresh requirement" may be performed. In some embodiments, the determining may include counting the number of refresh commands received in the period of time and comparing the number to a threshold value, for example, as described with reference to FIG. 4. In other embodiments, a multi-stage circuit may be used to make the determination.

At block 604, "allowing the memory device to perform an access command provided by the controller" may be performed when the refresh requirement is met. For example, a refresh compliance circuit may permit an internal activation signal ACT to activate in response to an access command provided by the controller.

At block 606, "initiating a lockout to prevent the memory device to perform the access command provided by the controller" may be performed when the refresh requirement is not met. For example, the refresh compliance circuit may prevent the internal activation signal ACT from activating in response to an access command. In some embodiments, the method 600 may further include entering a self-refresh mode when the refresh requirement is not met and/or performing a targeted refresh operation when the refresh requirement is not met. In some embodiments, a control signal may be provided to a refresh control circuit. The control signal may initiate the self-refresh mode and/or targeted refresh operation in some embodiments. In some embodiments, the control signal provided may be based, at least in part, on a pattern of commands received from the controller (e.g., many access commands with no refresh commands, little or no commands whatsoever).

At block 608, "ending the lockout responsive to receiving at least one command from the controller configured to end the lockout" may be performed. The command may be provided by a controller, such as controller 10 and/or 302. In some embodiments, the lockout may not be ended until the self-refresh mode has refreshed the entirety (e.g., all the word lines) of a memory array of the memory device and/or targeted refresh operations have refreshed all of the victim rows.

Optionally, method 600 may further include performing at block 610, "writing a value to a mode register responsive to receiving a mode register write command." In some embodiments, the determining performed at block 602 may be enabled or disabled based on the value written to the mode register. In some embodiments, block 610 may be performed prior to block 602. In some embodiments, block 610 may be performed concurrently or substantially concurrently with block 602. In some embodiments, the memory may default to ignoring access commands received prior to the writing of the value to the mode register that enables the determining of refresh compliance.

Optionally, method 600 may further include performing at block 612 "providing an active signal when the refresh requirement is not met." In some embodiments, the active signal may be provided to an external terminal, such as an alert terminal as shown in FIG. 2. Although shown as occurring after block 606, in some embodiments, block 612 may be performed prior to or at substantially the same time as block 606.

The apparatuses, systems, and methods disclosed herein may provide techniques for ensuring compliance with refresh requirements, such as those defined by a standard or specification. The ensuring compliance may further include taking actions to protect the memory and/or data stored in a memory array. This may help ensure data integrity even when refresh requirements are not met. The apparatuses, systems, and methods disclosed herein may further provide for a memory device to respond to a controller in a predictable manner after the controller has failed to maintain compliance. This may allow a controller to regain compliance in certain situations, which may reduce system failures.

Any one of the examples, embodiments or processes described herein may be combined with one or more other examples, embodiments and/or processes or be separated and/or performed amongst separate devices or device portions in accordance with the present systems, apparatuses, and methods.

The present description of certain embodiments is merely exemplary in nature and is in no way intended to limit the scope of the disclosure or its applications or uses. In the detailed description of embodiments of the present apparatuses, systems and methods, reference is made to the accompanying drawings which form a part hereof, and which are shown by way of illustration specific embodiments in which the described apparatuses, systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features are not be discussed when they would be apparent to those with skill in the art so as not to obscure the description of embodiments of the disclosure.

Finally, the above-discussion is intended to be merely illustrative of the present apparatuses, systems, and methods, and should not be construed as limiting the appended claims to any particular embodiment or group of embodiments. Thus, while the present apparatuses, systems, and methods have been described in particular detail with reference to exemplary embodiments, it should also be appreciated that numerous modifications and alternative embodiments may be devised by those having ordinary skill in the art without departing from the broader and intended spirit and scope of the present apparatuses, systems, and methods as set forth in the claims that follow. Accordingly, the specification and drawings are to be regarded in an illustrative manner and are not intended to limit the scope of the appended claims.

What is claimed is:

1. An apparatus comprising:
a controller configured to responsive to a signal indicating that at least a portion of a memory array of a memory device is inaccessible by the controller or a host device comprising the controller, providing at least one command to access to the at least one portion of the memory array, wherein the controller is further configured to provide a mode register write command to write a value to a mode register of the memory device, wherein the value indicates whether an initialization is completed.

2. The apparatus of claim 1, wherein the at least one command comprises an exit self-refresh command.

3. The apparatus of claim 1, wherein the at least one command comprises a number of refresh commands equal to a number of postponed refresh commands.

4. The apparatus of claim 1, wherein the at least one command comprises a number of refresh commands equal to a number sufficient to refresh an entirety of the memory array.

5. The apparatus of claim 1, wherein the signal is provided by the memory device.

6. The apparatus of claim 1, wherein the signal comprises a determination by the controller that the memory device failed to respond to an access command provided by the controller.

7. An apparatus comprising:
a memory device configured to receive commands from a controller, wherein the memory device comprises a refresh compliance circuit configured to:
monitor the commands to determine whether the controller is in compliance with a refresh requirement;
when the controller is in compliance with the refresh requirement, allow the memory device to perform access commands provided by the controller;
when the controller is not in compliance with the refresh requirement, initiate a lockout to prevent the memory device to perform the access commands provided by the controller;
allow the memory device to perform access commands provided by the controller when the controller provides at least one command to end the lockout; and
allow the memory device to perform access commands provided by the controller after a delay from when the controller provides the at least one command to end the lockout.

8. The apparatus of claim 7, wherein the memory device further comprises a mode register, wherein the refresh compliance circuit is enabled by a value written to the mode register by the controller.

9. The apparatus of claim 7, wherein the refresh requirement comprises a number of refresh commands received in a period of time.

10. The apparatus of claim 9, wherein the refresh compliance circuit comprises a counter configured to count the number of refresh commands received in the period of time.

11. The apparatus of claim 10, wherein the refresh compliance circuit further comprises a comparator configured to compare a value of the counter to a threshold value and the controller is determined to be in compliance based on a comparison of the value of the counter and the threshold value.

12. The apparatus of claim 7, wherein the refresh requirement comprises a frequency at which refresh commands are received.

13. The apparatus of claim 7, wherein the refresh compliance circuit is further configured to cause the memory device to enter a self-refresh mode when the controller is not in compliance with the refresh requirement.

14. The apparatus of claim 7, wherein the refresh compliance circuit is further configured to cause the memory device to perform a targeted refresh operation when the controller is not in compliance with the refresh requirement.

15. The apparatus of claim 7, wherein the memory device further comprises a refresh control circuit, and the refresh compliance circuit is further configured to provide a control signal to the refresh control circuit when the controller is not in compliance with the refresh requirement, wherein the control signal is based, at least in part, on a pattern of the commands provided by the controller.

16. The apparatus of claim 7, wherein the delay is a period of time sufficient to complete servicing of a plurality of victim rows.

17. The apparatus of claim 7, wherein the delay is a period of time sufficient to refresh all word lines of a memory array of the memory device.

18. The apparatus of claim 7, wherein the memory device further comprises an external terminal, wherein the refresh compliance circuit is configured to activate a signal provided to the external terminal when the controller is not in compliance with the refresh requirement.

19. A method comprising:
receiving, at a controller from a memory device, a signal indicating that at least a portion of a memory array of the memory device is inaccessible by the controller or a host device comprising the controller;
responsive to receiving the signal, providing at least one command configured to access to the at least one portion of the memory array; and
providing a mode register write command to cause a value to be written to a mode register of the memory device, wherein the value indicates a status of an initialization.

20. The method of claim 19, wherein the at least one command comprises an exit self-refresh command.

21. The method of claim 19, wherein the at least one command comprises a number of refresh commands equal to a number of postponed refresh commands.

22. The method of claim 19, wherein the at least one command comprises a number of refresh commands equal to a number sufficient to refresh an entirety of the memory array.

23. The method of claim 19, further comprising determining, with the controller that the memory device failed to respond to an access command provided by the controller, wherein the signal is provided responsive to the determination.

24. A method comprising:
determining whether commands received from a controller at a memory device meets a refresh requirement;
allowing the memory device to perform an access command provided by the controller when the refresh requirement is met;
initiating a lockout to prevent the memory device to perform the access command provided by the controller when the refresh requirement is not met;
entering a self-refresh mode when the refresh requirement is not met; and
ending the lockout responsive to receiving at least one command from the controller configured to end the lockout, wherein ending the lockout is performed after the self-refresh mode has refreshed all word lines of a memory array of the memory device.

25. The method of claim 24, further comprising:
writing a value to a mode register responsive to receiving a mode register write command; and
enabling the determining based on the value written to the mode register.

26. The method of claim 24, wherein the refresh requirement comprises a number of refresh commands received in a period of time.

27. The method of claim 26, wherein the determining comprises counting the number of refresh commands received in the period of time and comparing the number to a threshold value.

28. A method comprising:
determining whether commands received from a controller at a memory device meets a refresh requirement;
allowing the memory device to perform an access command provided by the controller when the refresh requirement is met;
initiating a lockout to prevent the memory device to perform the access command provided by the controller when the refresh requirement is not met;
ending the lockout responsive to receiving at least one command from the controller configured to end the lockout; and
performing a targeted refresh operation when the refresh requirement is not met, wherein ending the lockout is performed after the targeted refresh operation has refreshed all victim word lines of a memory array of the memory device.

29. The method of claim 24, further comprising providing an active signal when the refresh requirement is not met.

30. The method of claim 24, further comprising providing a control signal to a refresh control circuit, wherein the control signal is based, at least in part, on a pattern of the commands received from the controller.

* * * * *